(12) United States Patent
Stanley et al.

(10) Patent No.: US 6,420,243 B1
(45) Date of Patent: Jul. 16, 2002

(54) METHOD FOR PRODUCING SOI WAFERS BY DELAMINATION

(75) Inventors: Timothy Daryl Stanley; Peter Stanley, both of Austin, TX (US)

(73) Assignee: Motorola, Inc., Schaumburg, IL (US)

(*) Notice: Subject to any disclaimer, the term of this patent is extended or adjusted under 35 U.S.C. 154(b) by 36 days.

(21) Appl. No.: 09/729,502

(22) Filed: Dec. 4, 2000

(51) Int. Cl.[7] .......................... H01L 21/30; H01L 21/46
(52) U.S. Cl. .................... 438/458; 438/455; 438/459
(58) Field of Search ................... 438/458, 455, 438/459

(56) References Cited

U.S. PATENT DOCUMENTS

| | | | |
|---|---|---|---|
| 5,714,395 A | 2/1998 | Bruel | 437/24 |
| 5,882,987 A | 3/1999 | Srikrishnan | 438/458 |
| 5,920,764 A * | 7/1999 | Hanson et al. | 438/4 |
| 5,966,620 A | 10/1999 | Sakaguchi et al. | 438/455 |
| 6,124,185 A * | 9/2000 | Doyle | 438/458 |
| 6,245,645 B1 * | 6/2001 | Mitani et al. | 438/455 |
| 6,284,629 B1 * | 9/2001 | Yokokawa et al. | 438/459 |
| 6,312,797 B1 * | 11/2001 | Yokokawa | 428/336 |

OTHER PUBLICATIONS

"Basic mechanisms involved in the Smart–Cut–process", Microelectronic Engineering, vol. 3, No. 1 to 4, Jun. 1, 1997, pp. 233 to 240.
Advertisement papers by Soitec SA, 38 190 Bernin, France.

* cited by examiner

Primary Examiner—Alexander G. Ghyka

(57) ABSTRACT

This invention provides a method for producing SOI wafers by delamination comprising the steps of preparing a first wafer (2) having an insulating layer (3) on its both major surfaces; providing two delamination planes (4; 4') in the interior of said first wafer (2); bonding a second wafer (1) on one side of the first wafer (2); bonding a third wafer (1') on the other side of the first wafer (2); and delaminating said second and third wafers (1; 1') from said first wafer (2) such that each of said second and third wafers (1; 1') carries a SOI layer (3, 7; 3', 7') on one of its major surfaces.

6 Claims, 2 Drawing Sheets

-PRIOR ART-

METHOD FOR PRODUCING SOI WAFERS BY DELAMINATION

FIELD OF THE INVENTION

The present invention generally relates to semiconductor manufacturing, and, more particularly, to a method for producing and wafers by delamination.

BACKGROUND OF THE INVENTION

A general introduction to the fabrication of SOI wafers by the hydrogen ion delaminating method may be found in Aspar et al., "Basic mechanisms involved in the smart-cut-process", Microelectronic Engineering, Vol. 3, No. 1 to 4, Jun. 1, 1997, pages 233 to 240.

The continuing volume growth of portable systems with their increasing demand for better performance and autonomy makes SOI (silicon on insulator) a very attractive approach for large-volume integrated circuit production dedicated to low-voltage, low-power, high-speed systems. The capability of SOI circuits to operate at 1 Volt or below even in the case of DRAM's has been demonstrated as a best compromise between speed and power consumption. SOI is also appropriate for the gigabit DRAM generation and the system on ship approach.

FIG. 1 with diagrams 10–50 illustrates a known method for producing SOI wafers by hydrogen ion delamination. According to diagram 10, two silicon mirror-polished wafers 1, 2, namely a base wafer 1 to be a base and a bond wafer 2 to become a SOI wafer are prepared according to device specifications.

As shown in diagram 20, at least one of the wafers 1, 2, here the bond wafer 2, is subjected to thermal oxidation so as to form on the surface thereof an oxide film 3 having a thickness of about 0.1 $\mu$m to 2.0 $\mu$m.

As depicted in diagram 30, hydrogen ions $H^+$ are implanted into one surface of the bond wafer 2 on which the oxide film 3 is formed in order to form a fine bubble layer 4 which extends in parallel to the surface at a position corresponding to the mean depths of the ion implantation step. The ion implantation temperature amounts preferably to 25 to 450° C.

Having regard to diagram 40, the base wafer 1 is superimposed on the hydrogen ion-implanted surface of the hydrogen ion-implanted bond wafer 2 via the oxide film 3, and both wafers are brought in close contact with each other. When the surfaces of the two wafers are brought into contact with each other at ambient temperature in a clean atmosphere, the wafers adhere to each other without use of adhesive or the like, which is called direct bonding phenomena.

As illustrated in diagram 50, then a heat treatment is performed for delaminating (splitting) such that a delamination wafer 5 is delaminated from a SOI wafer 6 which is composed of the SOI layer 7, a buried oxide layer 3 and the base wafer 1. In this process step, the fine bubble layer 4 formed by the ion implantation step is used as a delamination plane. The heat treatment is performed, for example, at a temperature of about 500° C. or higher in an inert gas atmosphere so as to cause crystal rearrangement and bubble cohesion such that the delaminated wafer 5 is delaminated from the SOI wafer 6.

Further process steps which are not illustrated in FIG. 1 may comprise the steps of annealing up to temperatures of the order of 1100° C. in order to strengthen the bonds and chemical-mechanical polishing in order to provide a smooth surface. Preferably, the bonding heat treatment is performed in an inert gas atmosphere for 30 minutes to 2 hours.

In another known approach, a heat treatment in a reducing atmosphere containing hydrogen may be performed in order to remove the damage layer on the surface of the SOI layer and improve the surface roughness.

Finally, if the delaminated wafer 5 has an appropriate thickness, it can be used as a new bond wafer or base wafer after an appropriate treatment. A major disadvantage of the known technique is that it is not very economical.

The present invention seeks to provide to a method for producing SOI wafers by delamination which mitigates or avoids these and other disadvantages and limitations of the prior art and provides a more economical solution.

DETAILED DESCRIPTION OF A PREFERRED EMBODIMENT

In accordance with the present invention, a method for producing SOI wafers by delamination comprises the steps of preparing a first wafer having an insulating layer on its both major surfaces; providing two delamination planes in the interior of said first wafer; bonding a second wafer on one side of the first wafer; bonding a third wafer on the other side of the first wafer; and delaminating said second and third wafers from said first wafer such that each of said second and third wafers carries a SOI layer on one of its major surfaces.

The general idea underlying the present invention is to provide two delamination planes on a single bond wafer such that two SOI wafers may be obtained in one delamination step. This has the major advantage that the throughput of the SOI wafer production process may be doubled in comparison to the conventional process According to a preferred embodiment, said first, second and third wafers are silicon wafers and said insulating layer is an $SiO_2$ layer. According to a another embodiment, said delamination planes are provided by ion implantation of hydogen ions. According to a another embodiment, said ion implantation of hydrogen ions is performed simultaneously on both sides of said first wafer. According to a another embodiment, said delamination is performed by a heat treatment at a temperature of about 500° C. or higher in an inert gas atmosphere. According to a another embodiment, after delamination said first wafer is prepared as a new first wafer for a next delamination cycle.

Throughout the figures, the same reference signs denote the same or equivalent parts.

Figure 2:
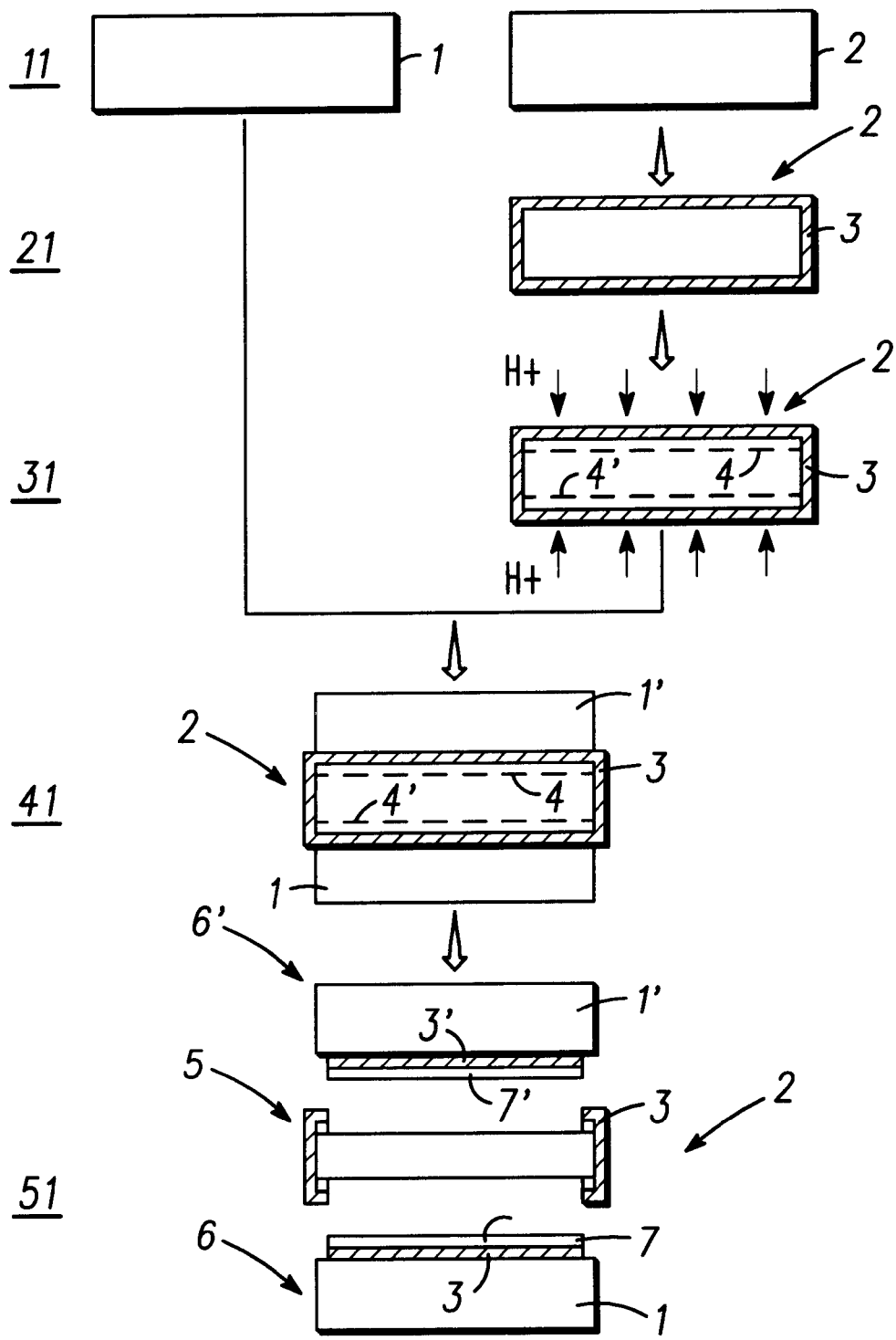
FIG. 2 illustrate a first embodiment of a method for producing SOI wafers by hydrogen ion delamination according to the present invention.

FIG. 2 with diagrams 11–51 illustrates a first embodiment of a method for producing SOI wafers by hydrogen ion delamination according to the present invention.

Figure 1:
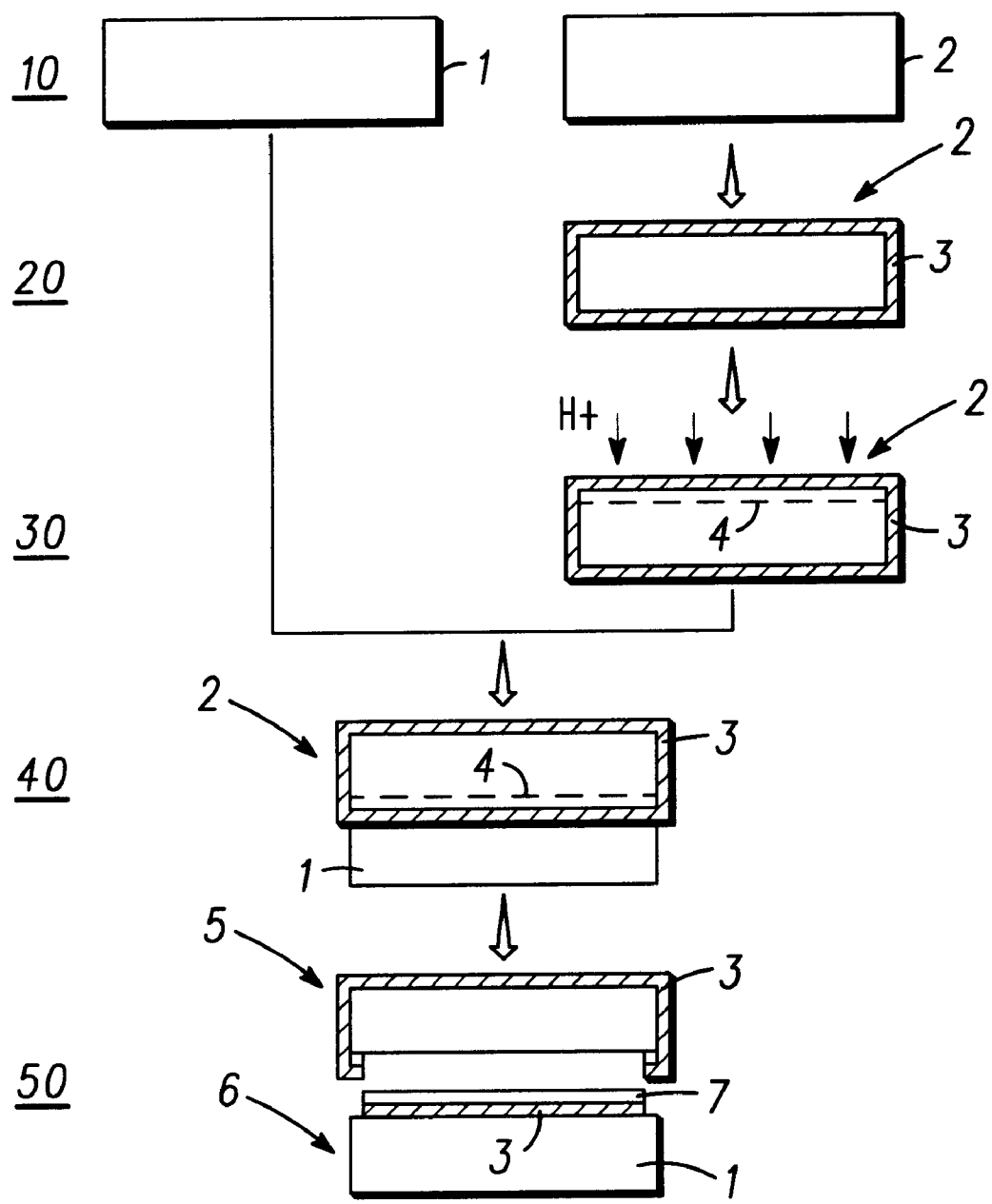
FIG. 1 illustrate a known method for producing SOI wafers by hydrogen ion delamination.

According to diagram 11, a base wafer 1 and a bond wafer 2 are prepared as in the conventional approach discussed with respect to diagrams 10–50 in FIG. 1. Also, an oxide film 3 is formed on the bond wafer 2 in conventional fashion.

However, as depicted in diagram 31, according to this embodiment of the invention, hydrogen ions $H^+$ are implanted in both the front and the rear major surfaces of the oxidized bond wafer 2 in order to form a respective fine bubble layer 4 and 4' on each side of the bond wafer 2. The formation of the two fine bubble layers 4, 4' may be performed simultaneously or sequentially and may be performed with the same implantation parameters of different ones. As already mentioned, the implantation temperature amounts preferably to 250 to 450° C.

With respect to diagram 41, two base wafers 1 and 1' are superimposed on both hydrogen ion-implanted surfaces of the hydrogen ion-implanted bond wafer 2 via the oxide film 3, and the bond wafer 2 is brought in close contact with both base wafers 1, 1' in order to form a wafer sandwich comprising the bond wafer 2 and the two base wafers 1, 1'.

Then, as depicted in diagram 51, the conventional heat treatment for delaminating (splitting) is performed in which the delamination wafer 5 is delaminated from two SOI wafers 6, 6' having the fine bubble layers 4, 4' as delamination planes.

The further process steps can be performed as known from the prior art cited above. The above explained embodiment has the major advantage that the throughput of the SOI wafer production process may be doubled in comparison to the conventional process, because two SOI wafers may be obtained from a single delamination wafer 5.

Of course, if the delamination wafer 5 has a sufficient thickness, it may be used for further delamination cycles after appropriate treatment.

While the invention has been described in terms of particular structures, devices and methods, those of skill in the art will understand based on the description herein that it is not limited merely to such examples and that the full scope of the invention is properly determined by the claims that follow.

The process of producing SOI wafers according to the present invention is not limited to the above explained embodiment. Other processes such as cleaning, heat treatment or the like can be added thereto.

What is claimed is:

1. A method for producing SOI wafers by delamination method comprising the steps of:
   preparing a first wafer having an insulating layer on its both major surfaces;
   providing two delamination planes in the interior of said first wafer;
   bonding a second wafer on one side of the first wafer
   bonding a third wafer on the other side of the first wafer; and
   delaminating said second and third wafers from said first wafer such that each of said second and third wafers carries a SOI layer on one of its major surfaces.

2. The method according to claim 1, wherein said first, second and third wafers are silicon wafers and said insulating layer is an $SiO_2$ layer.

3. The method according to claim 1, wherein said delamination planes are provided by ion implantation of hydrogen ions.

4. The method according to claim 3, wherein said ion implantation of hydrogen ions is performed simultaneously on both sides of said first wafer.

5. The method according to claim 1, wherein said delamination is performed by a heat treatment at a temperature of about 500° C. or higher in an inert gas atmosphere.

6. The method according to claim 1, wherein after delamination said first wafer is prepared as a new first wafer for a next delamination cycle.

* * * * *